US012660091B2

(12) United States Patent
Paavola et al.

(10) Patent No.: US 12,660,091 B2
(45) Date of Patent: Jun. 16, 2026

(54) PRINTED CIRCUIT BOARD WITH AN EDGE STIFFENER STRUCTURE

(71) Applicant: Intel Corporation, Santa Clara, CA (US)

(72) Inventors: Juha Tapani Paavola, Hillsboro, OR (US); Kari Pekka Johannes Mansukoski, Hillsboro, OR (US); Sami M. Heinisuo, Dallas, OR (US)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 17/704,847

(22) Filed: Mar. 25, 2022

(65) Prior Publication Data

US 2022/0217848 A1     Jul. 7, 2022

(51) Int. Cl.
*H05K 1/18* (2026.01)
*H05K 1/182* (2026.01)

(52) U.S. Cl.
CPC ... *H05K 1/182* (2013.01); *H05K 2201/10378* (2013.01); *H05K 2201/10393* (2013.01); *H05K 2201/10734* (2013.01)

(58) Field of Classification Search
CPC .......... H05K 2201/10378; H05K 2201/10393; H05K 2201/10734; H05K 1/182; H05K 1/0271
See application file for complete search history.

(56) References Cited

U.S. PATENT DOCUMENTS

2007/0009718 A1* 1/2007 Kanda .................. H05K 3/4608
                                                      428/209
2008/0308305 A1* 12/2008 Kawabe ............... H05K 1/0271
                                                      174/255
2016/0073493 A1* 3/2016 Leung ............... H01L 23/49816
                                                      174/250

* cited by examiner

*Primary Examiner* — Jeremy C Norris
(74) *Attorney, Agent, or Firm* — Alliance IP, LLC

(57) ABSTRACT

A printed circuit board (PCB) is enhanced with an edge stiffener structure. The edge stiffener structure may be fastened to the PCB in a variety of ways, including using solder, adhesive, or removably attaching with snaps. Removably attached edge stiffening structures may be reused. Edge stiffener structures can overlap on one or both surfaces of a PCB. Some edge stiffener structures include extensions that fit into C-clamps and D-clamps.

25 Claims, 10 Drawing Sheets

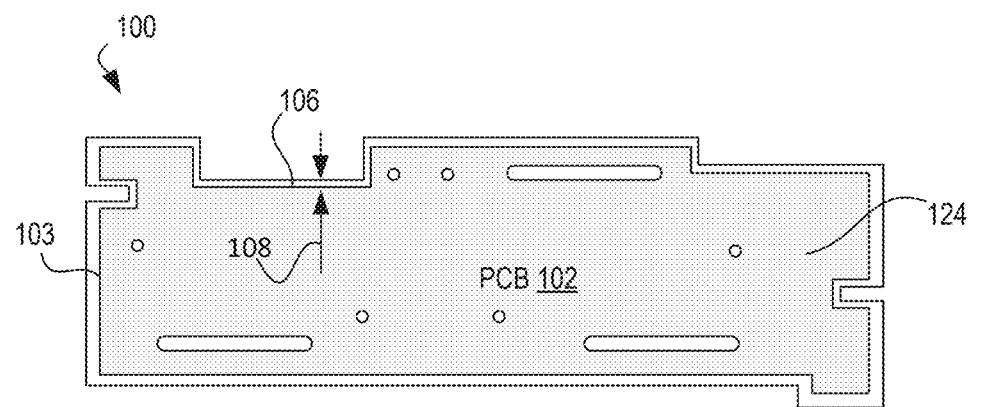
FIG. 1A
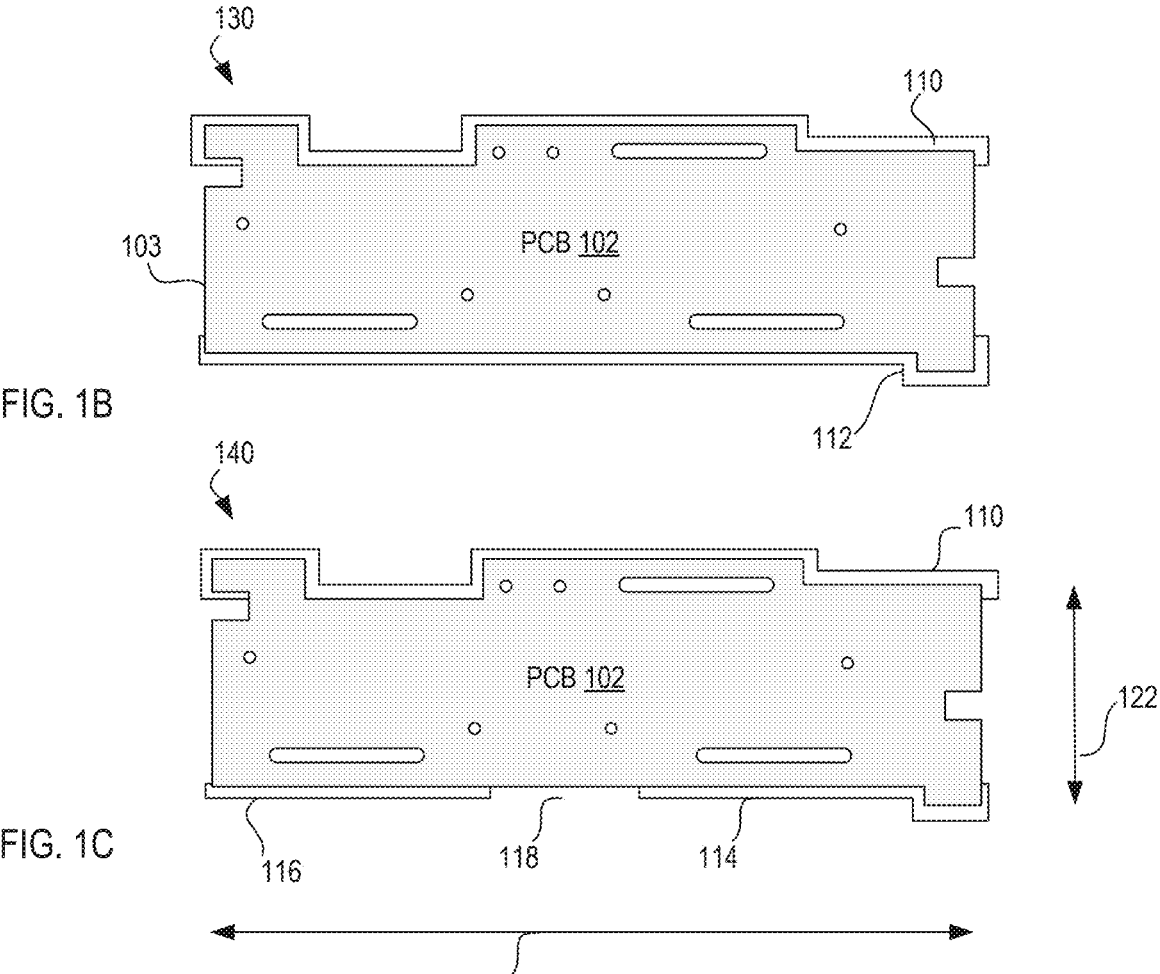
FIG. 1B
FIG. 1C

700

702

702

HOUSING 1026

1000

| PROCESSOR UNIT 1002 | COMMUNICATION COMPONENT 1012 |
| MEMORY 1004 | BATTERY/POWER 1014 |
| DISPLAY DEVICE 1006 | GNSS DEVICE 1018 |
| AUDIO OUTPUT DEVICE 1008 | AUDIO INPUT DEVICE 1024 |
| AN OTHER OUTPUT DEVICE 1010 | AN OTHER INPUT DEVICE 1020 |

ANTENNA 1022

PRINTED CIRCUIT BOARD WITH AN EDGE STIFFENER STRUCTURE

BACKGROUND

Advances in end-product form factor and thickness goals are some of the motivations for reducing the thickness of printed circuit boards (PCBs). However, when PCBs are thinned, they can become flexible and fragile. This technical problem can manifest as breakage during PCB manufacturing, component soldering processes, handling, product final assembly, or while the product is in use.

BRIEF DESCRIPTION OF THE DRAWINGS

FIGS. 1A-1C illustrate a printed circuit board with an edge stiffener structure, in accordance with various embodiments.

DETAILED DESCRIPTION

Figures 2A, 2B, 2C:
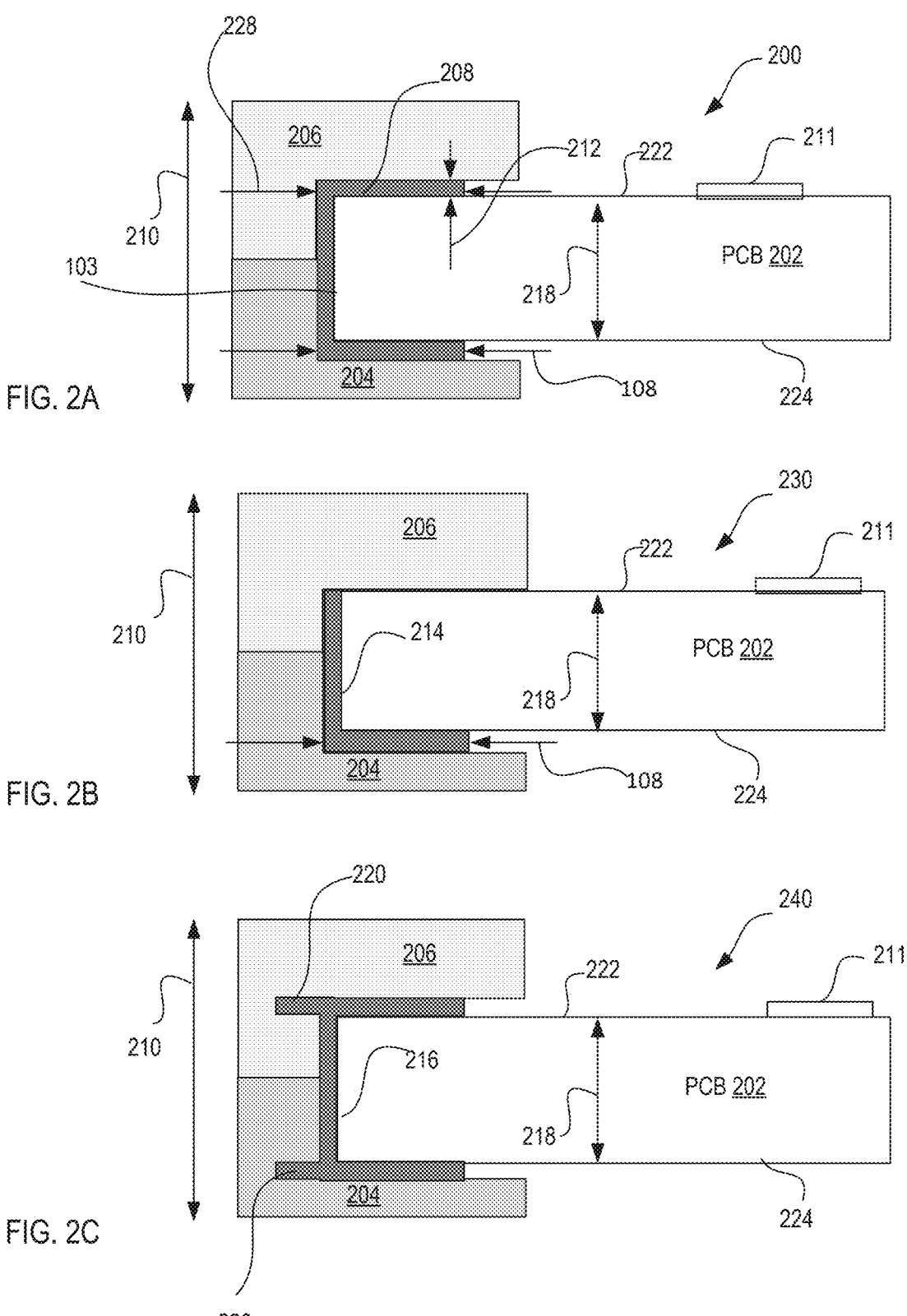
FIGS. 2A-2C illustrate variations in the edge stiffener structure, in accordance with various embodiments.

In operation, many printed circuit boards (PCB) s that are thinned to a thickness of 0.7 mm or less can have an undesirable amount of flexibility. Despite this, there are various scenarios driving a reduction in the thickness of PCBs to even a sub-0.7 mm thickness.

The increased flexibility of PCBs can lead to PCB breakage and/or breakage of any of its components during final product assembly. Additionally, the increased flexibility can cause reliability problems for the end product, in scenarios in which the PCB breaks while the product is in use. These technical issues can result in a reduced production yield and increased rates of failure in the field.

Embodiments provide a technical solution to this technical problem and other related enhancements to available PCBs, in the form of a printed circuit board (PCB) with a thickness at or below a threshold thickness, enhanced with an edge stiffener. Embodiments provide enhanced PCB performance for thinned PCBs, as compared to available thinned PCBs alone.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components. For example, with reference to FIGS. 2A-2C, the integrated circuit component 211 is located on the PCB 202).

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "processor unit", "processing unit" or "processor" may refer to any device or portion of a device that processes electronic data from registers and/or memory to transform that electronic data into other electronic data that may be stored in registers and/or memory. A processor unit may be a system-on-a-chip (SOC), and/or include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

As used herein, the term "electronic component" can refer to an active electronic component (e.g., a processing unit, a memory, a storage device, a field effect transistor (FET)) or a passive electronic component (e.g., resistor, inductor, capacitor).

As used herein, the term "integrated circuit component" can comprise one or more of any electronic components described or referenced herein or any other computing system component, such as a processor unit, I/O controller, memory, or network interface controller. Further, the integrated circuit component may be unpackaged or packaged. In one example of an unpackaged integrated circuit component, a single monolithic integrated circuit die comprises solder bumps attached to contacts on the die; the solder bumps allow the die to be directly attached to a printed circuit board (PCB). A packaged integrated circuit component can comprise one or more integrated circuit dies mounted on a package substrate with the integrated circuit dies and package substrate encapsulated in a casing material, such as a metal, plastic, glass, or ceramic. In one example, a packaged integrated circuit component has a solder ball grid array (BGA) on an exterior surface of the package substrate.

As used herein, the phrase "mechanically coupled" refers to components that are affixed or physically attached (as may be achieved by any combination of soldering, the use of adhesives, the use of fasteners, or the like) to each other, often, to achieve a resulting structure. In various embodiments, mechanically coupled can include releasably attached configurations, such as, those that require application of a torque exceeding a threshold torque to release them.

As may be appreciated by one with skill in the art, mechanically coupled is not necessarily mutually exclusive, a coupling between two components can facilitate more than one purpose.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

As may be appreciated, certain terminology, such as "ceiling" and "floor", as well as "upper,", "uppermost", "lower," "above," "below," "bottom," and "top" refer to directions based on viewing the Figures to which reference is made. Further, terms such as "front," "back," "rear,", "side", "vertical", and "horizontal" may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

FIGS. 1A-1C illustrate embodiments of an apparatus including a printed circuit board (PCB) with an edge stiffener structure. The PCB is understood to be planar (e.g., plus or minus 5 degrees), with a peripheral edge 103. In various embodiments, as dictated by a target application, there may be cutouts in the PCB for connectors and/or for airflow. With a focus on thin PCBs, in various embodiments, a thin PCB 102 has a thickness (FIG. 2A, 218) that is less than or equal to a threshold (thickness), and the stiffness of these thin PCBs is improved or enhanced with embodiments of the edge stiffener structures described herein. In some embodiments, the threshold is 0.7 millimeters (mm), therefore various embodiments described utilize a PCB 102 with a thickness is less than or equal to 0.7 mm. In a non-limiting example, in various embodiments, the PCB 102 is rectangular, having two opposing sides that are referred to as long sides 120 and two short sides 122 (alternately worded, the peripheral edge 103 comprises two parallel sides that are longer than remaining sides, defined as long sides, and the edge stiffener structure is located on a long side). Note that, although the peripheral edge 103 of the PCB 102 is uneven, having a somewhat jagged appearance, the edge stiffener structure conforms to the peripheral edge 103. In various embodiments, the edge stiffener structure comprises a metal. In some embodiments, the edge stiffener structure comprises stainless steel; in other embodiments, the edge stiffener structure comprises other metals (for example copper), or any stiff material, such as carbon fiber.

The edge stiffener structure overlaps the peripheral edge on a first surface 124 of the PCB by a width 108. The width 108 is substantially consistent along the peripheral edge, or alternatively, for a length of the edge stiffener structure (e.g., a length of segment 110), but in various embodiments, the width 108 is less than 10 millimeters; and in various embodiments, the width is in a range of 1 to 3 millimeters. As used for the width 108, "substantially" means plus or minus 50%, for example, the width of substantially 2 millimeters includes a width of 1 millimeter to a width of 3 millimeters. Additionally, the edge stiffener structure extends along at least a portion of the entire peripheral edge 103. In various embodiments, the portion is 50% of the entire peripheral edge 103.

In various embodiments, obtaining the 50% or more of the peripheral edge coverage can be achieved in different ways. In the embodiment of FIG. 1A, the edge stiffener structure 106 is continuous around the peripheral edge 103, obtaining 100% coverage of the peripheral edge 103. In the embodiment of FIG. 1B, the edge stiffener structure is discontinuous, comprising segment 110 and segment 112. In the embodiment of FIG. 1C, the edge stiffener structure is also discontinuous, comprising segment 110 on a first long side, and on another long side, segment 114 and segment 116. As may be appreciated by those with skill in the art, for a rectangular PCB 102, a more robust result can be achieved when the edge stiffener structure is applied on at least one long side, such as is indicated with segment 110. When the edge stiffener structure is discontinuous, there may be gaps 118 between segments. The location and size of the gaps 118 may be informed by the end application or device (e.g., FIG. 10, device 1000) that uses the PCB structure.

Turning now to FIGS. 2A-2C, simplified cross-sectional illustrations depict embodiments of devices (200, 230, and 240) that may include the apparatuses described in FIGS. 1A-1C. As mentioned, the PCB 102 has a thickness 218 and is planar; references to a "surface" are to planar surfaces (e.g., a first surface of the PCB 202 may be an upper surface 222 or a lower surface 224, where the lower surface 224 is an opposing surface to the upper surface 222, and vice versa, as well as the second surface being an opposing surface to the first surface). As may be appreciated, the edge stiffener structure may extend to overlap a second surface of the PCB 102, as shown in the embodiment of FIG. 2A.

In various embodiments, the PCB 202 is secured in between a top/first securing structure 206 and a bottom/second securing structure 204. The bottom securing structure 204 may be attached to the top securing structure 206 and attached to the apparatus on a lower surface 224 of the PCB 202. There is an overall package height 210 that includes the top securing structure 206 plus the bottom securing structure 204.

In various embodiments, such as a laptop, a tablet computer, and a phone (e.g., FIG. 10 when the device 1000 is a laptop), the top securing structure 206 may be a C-cover, and the bottom securing structure 204 may be either a D-cover or a chassis, and a combined height of the C-cover and the D-cover (the package height 210) define a laptop base height. In various embodiments of a laptop base, the "C cover" comprises an upward facing keyboard, viewed when the device (e.g., FIG. 10, device 1000) is an open configuration and the "D cover" is the bottom of the laptop base. In some embodiments, the laptop base further comprises a primary computing resource (e.g., a host processor unit(s) or GPU) of the device 1000, along with a battery, memory, and storage, and the laptop base communicates with a lid via wires that pass through a hinge.

The edge stiffener structure 208 has a height 212 (note that "height" is used here to distinguish from the thickness described in connection with the PCB, and those with skill in the art will recognize that this height refers to a thickness of the edge stiffener structure 208. The height 212 is measured perpendicularly (e.g., plus or minus 5 degrees) from the planar surface of the PCB 202 on which it is attached. Accordingly, in various PCB structure embodiments, either the top securing structure 206 or the bottom securing structure 204, or both, are thinned to accommodate the edge stiffener structure without increasing the overall package height 210 or ultimate device (FIG. 10, Device 1000) height.

In the device 200, the edge stiffener structure 208 has a cross-section that is "U" shaped, overlapping the peripheral edge 103 on the upper surface 222 by a first width 228 and the lower surface 224 of the PCB 202 to a second width 108. In some embodiments, the first width 228 and the second width 108 are the same; in other embodiments, first width 228 and the second width 108 are not the same. The top supporting structure 206 is thinned by an amount needed to accommodate the height 212, and the bottom securing structure 204 is also thinned by the amount needed to accommodate the height 212.

In the device 230 of FIG. 2B, the edge stiffener structure 214 has a cross-section that is "L" shaped, overlapping the peripheral edge 103 on just one of the upper surface 222 or the lower surface 224 of the PCB 202 to the width 108 (it is illustrated as being located on the lower surface in this non-limiting example). The bottom securing structure 204 is thinned to accommodate the edge stiffener structure 214 and to the extent that the edge stiffener structure 214 extends into the region of the top support structure 206, the top support structure is thinned accordingly.

In the device 240 (shown in FIG. 2C), the edge stiffener structure 216 comprises an extension 220 that projects laterally away from the PCB (with respect to the figures, the projection is perpendicular from what is referred to as a "side" of the PCB, and generally parallel to the surfaces of the PCB) from the peripheral edge 103. In various embodiments, the extension 220 is configured to fit into one of the top securing structure 206 (e.g., via a notch or etched divot, as shown) and the bottom securing structure 204. The extension 220 may serve to stabilize the PCB 202 in between the top securing structure 206 and bottom securing structure 204. In various embodiments, the edge stiffener structure may comprise a first extension 220 and a second extension 226, both projecting laterally away from the side of the PCB. In various embodiments the first extension 220 is configured to fit into the top securing structure 206 and the second extension 226 is configured to fit into the bottom securing structure 204, further increasing the stability of the PCB 202 in the device 240.

In the embodiments illustrated in FIGS. 2A-2C, the edge stiffener structures are embodiments of printed circuit board stiffening means.

In the embodiments illustrated in FIGS. 2A-2C, an integrated circuit component 211 is attached to a first surface of the PCB 202, which is an upper surface of the PCB 202. However, in other embodiments, the first surface of the PCB 202 can be a lower surface, and therefore the integrated circuit component 211 can be attached to the lower surface of the PCB 202. Moreover, in other embodiments, additional integrated circuit components may be attached to either the upper or the lower surface of PCB 202.

The edge stiffener structure may be further realized with different embodiments. For example, the edge stiffener structure can include or take the form of one or more corner stiffeners, shown in FIG. 3, 304).

Figure 3:
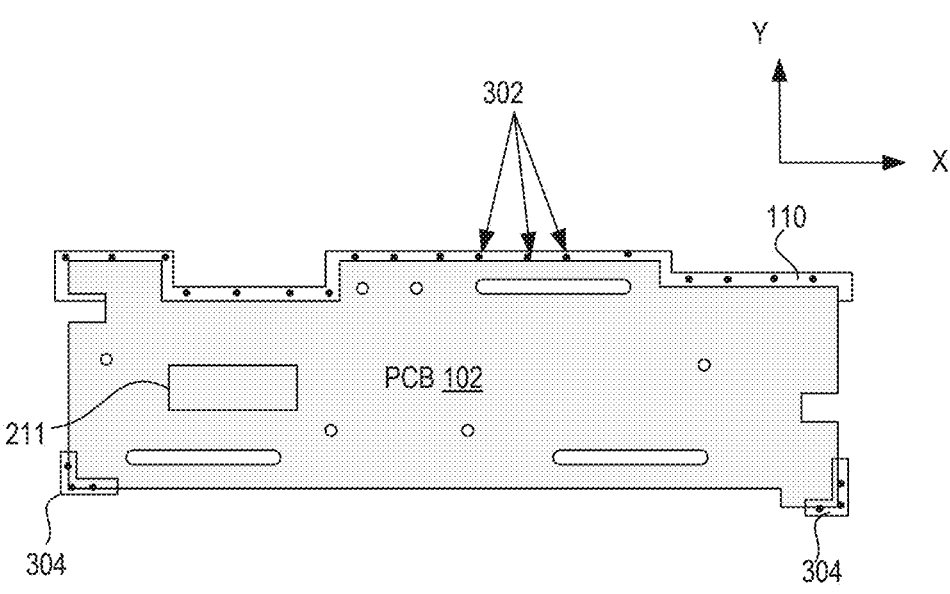
FIG. 3 is a simplified top view of a printed circuit board with an edge stiffener structure, showing a fastener used, in accordance with various embodiments.
Figure 4:
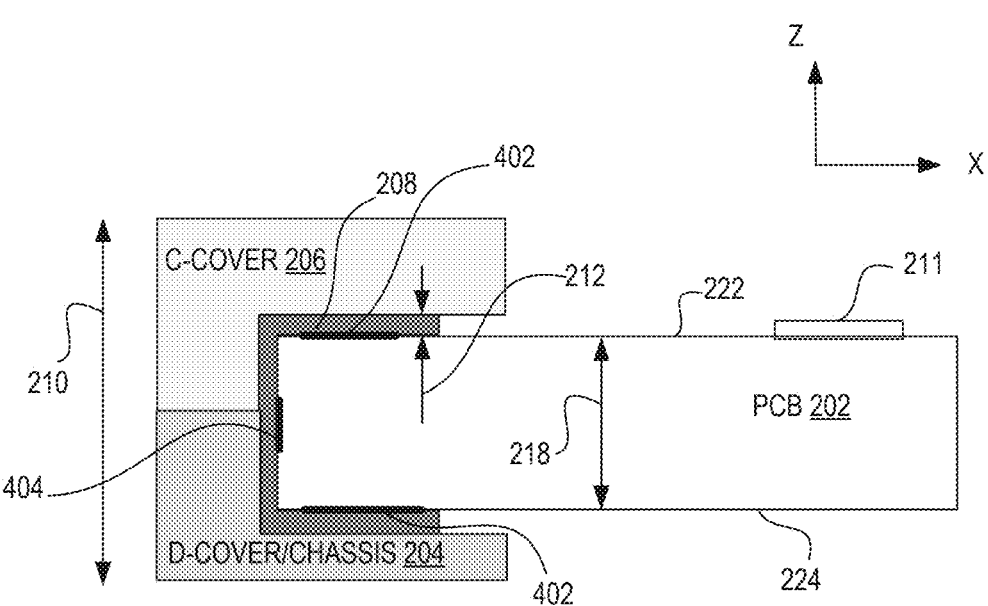
FIG. 4 is a simplified cross-sectional side view of a printed circuit board with edge stiffener structure, showing a fastener used, in accordance with various embodiments.

Continuing to FIG. 3 and FIG. 4, an edge stiffener structure is illustrated as fastened (also referred to as attached) to a PCB. In various embodiments, the edge stiffener structure comprises multiple segments (e.g., segment 110 and segment(s) 304) and each individual segment is fastened to the PCB using a plurality of solder bumps 302. The solder bumps may be spaced apart in generally equidistant spacing from a nearest neighbor. In a non-limiting example, the spacing may be 1 millimeter plus or minus 5%. In other embodiments, the edge stiffener structure may be fastened to the PCB using a combination of optional fastener(s) 402 and/or fastener(s) 404, which may comprise adhesives, solder, glue, or snaps. In some embodiments, the edge stiffener structure (including embodiments with individual segments and/or corner stiffeners) is removably attached to the printed circuit board by, fasteners (402 and/or 404) that are snap connections. A removed edge stiffener structure can be reused.

The selection of the material for the edge stiffener structure can have a significant effect on thermal expansion of the edge stiffener. However, if the stiffener thermal expansion is required to be isolated from the board thermal expansion, the edge stiffener structure can be attached by side-edge snap connection, which can result in it essentially floating in a longitudinal direction along the surface that it is applied. For example, in FIG. 4, attaching the edge stiffener structure to the PCB 202 utilizing only fasteners(s) 404, located on vertical sides of the PCB (wherein "vertical sides" are the thin edges of the PCB 202, perpendicular to the surfaces 222, and 224, as indicated in FIG. 4), the surfaces 222 and 224 may float inside the edge stiffener structure 208. This floating technique may be applied to any of the embodiments described so far, such as, the embodiments of FIGS. 2A-2C, and FIG. 3. Additionally, the material for the edge stiffener structure can be selected to provide grounding between the PCB and a chassis and/or to provide shielding for electromagnetic interference.

In some embodiments of a device (FIG. 10, 1000), a number of threads sets a required length for a screw tower. If this is the case edge stiffener structure can have a local cut-out for the screw tower. The effect of local cut-out is minor for the stiffness since the stiffness is conversely proportional to the third power of the edge length.

Figure 5:
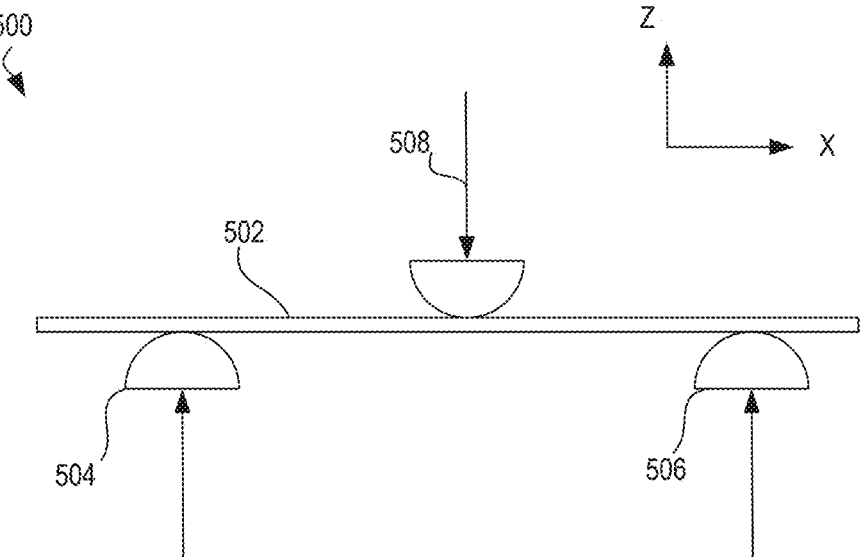
FIG. 5 is a simplified illustration showing a scenario for bend testing of a printed circuit board, in accordance with various embodiments.

FIG. 5 is a simplified cross-sectional view of a test setup 500 to measure bending stiffness of an example embodiment. The PCB 502 is placed on two supports, 504 and 506, and a load 508 is applied on the opposing side of the two supports, in between them. The PCB 502 thickness 218 is varied from 0.7 mm to 0.5 mm, in 0.1 mm increments. At each thickness 218, the edge stiffener structure thickness (herein referred to as height 212 to distinguish over the thickness of the PCB) is varied from 0 (not used at all) to 0.2 mm, in 0.05 mm increments. The PCB thickness of 0.7 mm is used as a reference for an amount of bend measured, and the percent change is noted in Table 1. As can be seen, the technical solution provided by these embodiments result in an objective bend improvement of up to 133% for a PCB 502 thickness of 0.5 with an edge stiffener structure thickness (height 212) of 0.2 mm. These results show that adding 0.2 mm edge stiffener around the peripheral edge of a 0.5 mm PCB achieves practically the same bend response as provided by the reference PCB with 0.7 mm thickness, thus mitigating various technical issues related to flexibility of thin PCBs.

TABLE 1

| PCB thickness [mm] | Stiffener [mm] | Stiffness N/mm | Change % vs. 0.70 mm | Improvement % Per PCB |
|---|---|---|---|---|
| 0.70 | 0.00 | 5.7 | Ref | Ref |
| 0.70 | 0.10 | 7.9 | 38% | 38% |
| 0.70 | 0.15 | 9.8 | 72% | 72% |
| 0.70 | 0.20 | 12.0 | 110% | 110% |
| 0.60 | 0.00 | 4.3 | −25% | Ref |
| 0.60 | 0.10 | 6.1 | 6% | 41% |
| 0.60 | 0.15 | 7.9 | 39% | 85% |
| 0.60 | 0.20 | 9.5 | 67% | 122% |
| 0.50 | 0.00 | 2.4 | −58% | Ref |
| 0.50 | 0.10 | 3.6 | −38% | 50% |
| 0.50 | 0.15 | 4.5 | −20% | 91% |
| 0.50 | 0.20 | 5.6 | −3% | 133% |

Figure 6:
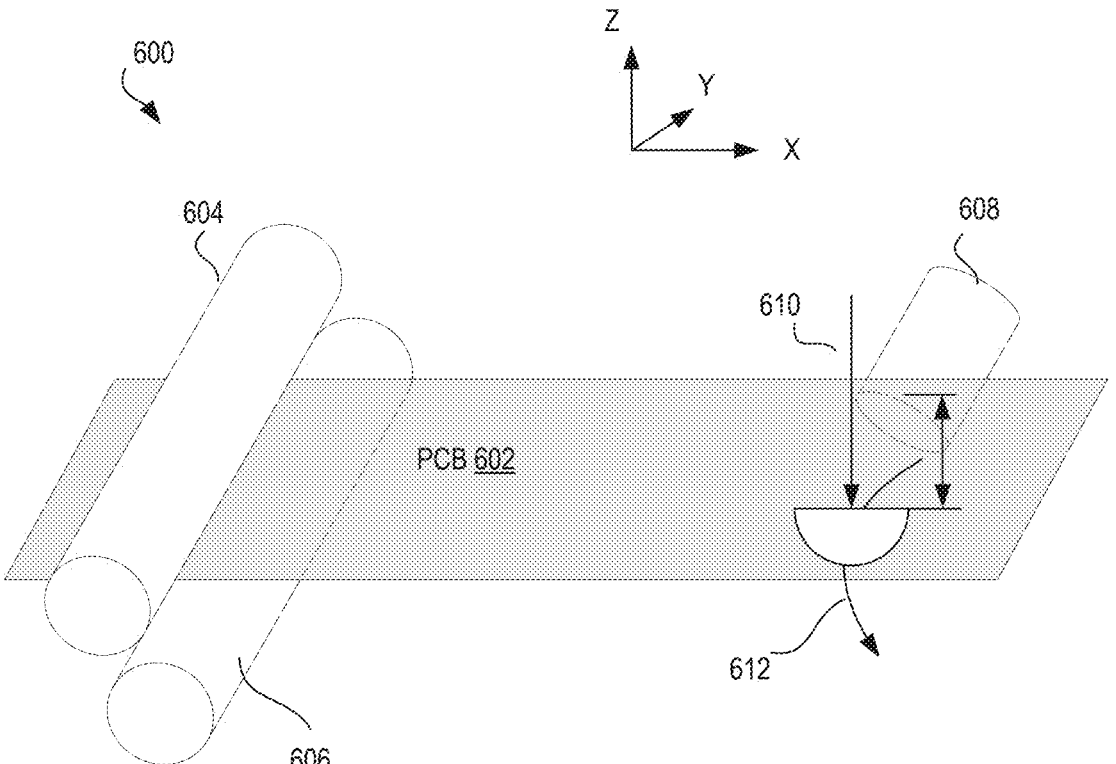
FIG. 6 is a simplified illustration showing a scenario for twist testing of a printed circuit board, in accordance with various embodiments.

FIG. 6 is a simplified three-dimensional illustration to show a test setup to measure torque or twisting response on an embodiment, for different PCB thicknesses and edge stiffener structure thicknesses. In the setup 600, the PCB 602 is secured between an upper 604 and lower 606 clamp at a first edge. At an opposing edge, a portion of the PCB 602 is supported by object 608, and a downward load 610 is applied at a predefined distance from the object 608, where the PCB 602 is not supported, causing a twist 612. The twist response is noted in Table 2.

TABLE 2

| PCB thickness [mm] | Stiffener [mm] | Stiffness N/mm | Change % vs. 0.70 mm | Improvement % Per PCB |
|---|---|---|---|---|
| 0.70 | 0.00 | 0.65 | Ref | Ref |
| 0.70 | 0.10 | 0.76 | 18% | 18% |
| 0.70 | 0.15 | 0.80 | 23% | 23% |
| 0.70 | 0.20 | 0.83 | 28% | 28% |
| 0.70 | 0.25 | 0.87 | 34% | 34% |
| 0.70 | 0.30 | 0.95 | 47% | 47% |
| 0.60 | 0.00 | 0.46 | −29% | Ref |
| 0.60 | 0.10 | 0.55 | −15% | 20% |
| 0.60 | 0.15 | 0.58 | −11% | 26% |
| 0.60 | 0.20 | 0.61 | −7% | 32% |
| 0.60 | 0.25 | 0.65 | −1% | 41% |
| 0.60 | 0.30 | 0.71 | 10% | 56% |
| 0.50 | 0.00 | 0.33 | −49% | Ref |
| 0.50 | 0.10 | 0.42 | −36% | 25% |
| 0.50 | 0.15 | 0.45 | −31% | 34% |
| 0.50 | 0.20 | 0.50 | −24% | 49% |
| 0.50 | 0.25 | 0.56 | −14% | 67% |
| 0.50 | 0.30 | 0.62 | −5% | 85% |

As Table 2 indicates, a response by embodiments to the twist test is also remarkable. The edge stiffener structure of a 0.20 mm thickness (height 212) that produced a same bending stiffness for 0.50 mm PCB as that of a 0.70 mm PCB without the edge stiffener structure in Table 1, also increased a twisting stiffness for that same 0.50 mm PCB by about 50%. Accordingly, embodiments provide improved functionality for PCB structures using sub-0.7 mm boards.

Figure 7:
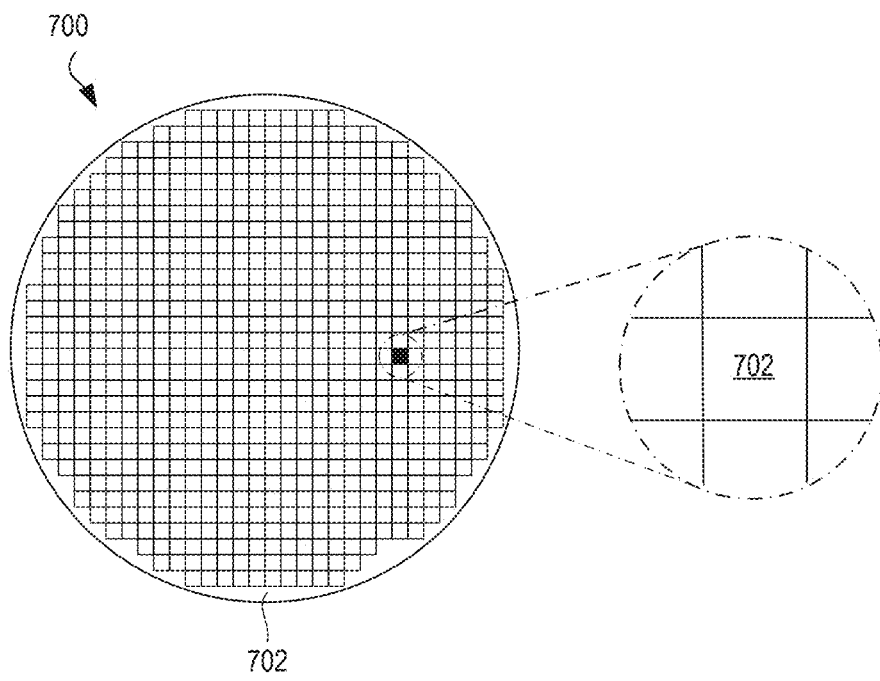
FIG. 7 is a top view of a wafer and dies that may embody integrated circuit components, in accordance with any of the embodiments disclosed herein.

FIG. 7 is a top view of a wafer 700 and dies 702 that may embody integrated circuit components, in accordance with any of the embodiments disclosed herein. The wafer 700 may be composed of semiconductor material and may include one or more dies 702 having integrated circuit structures formed on a surface of the wafer 700. The individual dies 702 may be a repeating unit of an integrated circuit product that includes any suitable integrated circuit. After the fabrication of the semiconductor product is complete, the wafer 700 may undergo a singulation process in which the dies 702 are separated from one another to provide discrete "chips" of the integrated circuit product. The die 702 may be any of the dies disclosed herein. The die 702 may include one or more transistors (e.g., some of the transistors 840 of FIG. 8, discussed below), supporting circuitry to route electrical signals to the transistors, passive components (e.g., signal traces, resistors, capacitors, or inductors), and/or any other integrated circuit components.

In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processor unit (e.g., the processor unit 1002 of FIG. 10) or other logic that is configured to store information in the memory devices or execute instructions stored in the memory array. Various ones of the microelectronic assemblies 900 disclosed herein may be manufactured using a die-to-wafer assembly technique in which some dies are attached to a wafer 700 that include others of the dies 702, and the wafer 700 is subsequently singulated.

Figure 8:
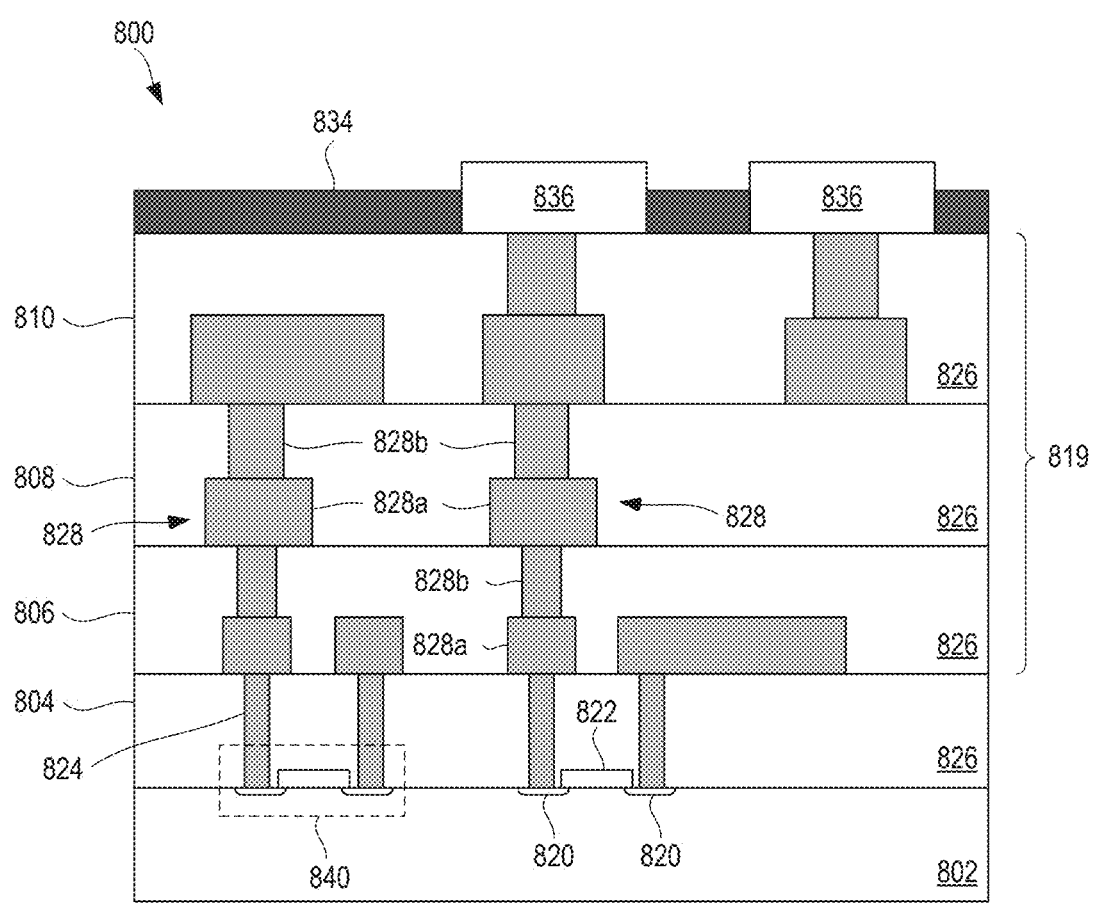
FIG. 8 is a simplified cross-sectional side view showing an implementation of an integrated circuit component on a die that may be included in any of the embodiments disclosed herein.

FIG. 8 is a cross-sectional side view of an integrated circuit component 800 implemented on a die that may be included in any of the that may embody integrated circuit components, in accordance with any of the embodiments disclosed herein. One or more of the integrated circuit components 800 may be included in one or more dies 702 (FIG. 7). The integrated circuit component 800 may be formed on a die substrate 802 (e.g., the wafer 700 of FIG. 7) and may be included in a die (e.g., the die 702 of FIG. 7). The die substrate 802 may be a semiconductor substrate composed of semiconductor material systems including, for example, n-type or p-type materials systems (or a combination of both). The die substrate 802 may include, for example, a crystalline substrate formed using a bulk silicon or a silicon-on-insulator (SOI) substructure. In some embodiments, the die substrate 802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 802. Although a few examples of materials from which the die substrate 802 may be formed are described here, any material that may serve as a foundation for an integrated circuit component 800 may be used.

The die substrate 802 may be part of a singulated die (e.g., the dies 702 of FIG. 7) or a wafer (e.g., the wafer 700 of FIG. 7).

The integrated circuit component 800 may include one or more device layers 804 disposed on the die substrate 802. The device layer 804 may include features of one or more transistors 840 (e.g., metal oxide semiconductor field-effect transistors (MOSFETs)) formed on the die substrate 802. The transistors 840 may include, for example, one or more source and/or drain (S/D) regions 820, a gate 822 to control current flow between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Continuing with FIG. 8, a transistor 840 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may consist of a U-shaped structure that includes a bottom portion substantially parallel to the surface of the die substrate 802 and two sidewall portions that are substantially perpendicular to the top surface of the die substrate 802. In other embodiments, at least one of the metal layers that form the gate electrode may simply be a planar layer that is substantially parallel to the top surface of the die substrate 802 and does not include sidewall portions substantially perpendicular to the top surface of the die substrate 802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the die substrate 802 adjacent to the gate 822 of individual transistors 840. The S/D regions 820 may be formed using an implantation/diffusion process or an etching/deposition process, for example. In the former process, dopants such as boron, aluminum, antimony, phosphorous, or arsenic may be ion-implanted into the die substrate 802 to form the S/D regions 820. An annealing process that activates the dopants and causes them to diffuse farther into the die substrate 802 may follow the ion-implantation process. In the latter process, the die substrate 802 may first be etched to form recesses at the locations of the S/D regions 820. An epitaxial deposition process may then be carried out to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the integrated circuit component 800.

The interconnect structures 828 may be arranged within the interconnect layers 806-810 to route electrical signals according to a wide variety of designs; in particular, the arrangement is not limited to the particular configuration of interconnect structures 828 depicted in FIG. 8. Although a particular number of interconnect layers 806-810 is depicted in FIG. 8, embodiments of the present disclosure include integrated circuit components having more or fewer interconnect layers than depicted.

In some embodiments, the interconnect structures 828 may include lines 828*a* and/or vias 828*b* filled with an electrically conductive material such as a metal. The lines 828*a* may be arranged to route electrical signals in a direction of a plane that is substantially parallel with a surface of the die substrate 802 upon which the device layer 804 is formed. For example, the lines 828*a* may route electrical signals in a direction in and out of the page and/or in a direction across the page. The vias 828*b* may be arranged to route electrical signals in a direction of a plane that is substantially perpendicular to the surface of the die substrate 802 upon which the device layer 804 is formed. In some embodiments, the vias 828*b* may electrically couple lines 828*a* of different interconnect layers 806-810 together.

The interconnect layers 806-810 may include a dielectric material 826 disposed between the interconnect structures 828, as shown in FIG. 8. In some embodiments, dielectric material 826 disposed between the interconnect structures 828 in different ones of the interconnect layers 806-810 may have different compositions; in other embodiments, the composition of the dielectric material 826 between different interconnect layers 806-810 may be the same. The device layer 804 may include a dielectric material 826 disposed between the transistors 840 and a bottom layer of the metallization stack as well. The dielectric material 826 included in the device layer 804 may have a different composition than the dielectric material 826 included in the interconnect layers 806-810; in other embodiments, the composition of the dielectric material 826 in the device layer 804 may be the same as a dielectric material 826 included in any one of the interconnect layers 806-810.

A first interconnect layer 806 (referred to as Metal 1 or "M1") may be formed directly on the device layer 804. In some embodiments, the first interconnect layer 806 may include lines 828*a* and/or vias 828*b*, as shown. The lines 828*a* of the first interconnect layer 806 may be coupled with contacts (e.g., the S/D contacts 824) of the device layer 804. The vias 828*b* of the first interconnect layer 806 may be coupled with the lines 828*a* of a second interconnect layer 808.

The second interconnect layer 808 (referred to as Metal 2 or "M2") may be formed directly on the first interconnect layer 806. In some embodiments, the second interconnect layer 808 may include via 828*b* to couple the lines 828*a* of the second interconnect layer 808 with the lines 828*a* of a third interconnect layer 810. Although the lines 828*a* and the vias 828*b* are structurally delineated with a line within individual interconnect layers for the sake of clarity, the lines 828*a* and the vias 828*b* may be structurally and/or materially contiguous (e.g., simultaneously filled during a dual-damascene process) in some embodiments.

The third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the integrated circuit component 800 (i.e., farther away from the device layer 804) may be thicker that the interconnect layers that are lower in the metallization stack 819, with lines 828*a* and vias 828*b* in the higher interconnect layers being thicker than those in the lower interconnect layers.

The integrated circuit component 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to external devices. For example, solder bonds may be formed on the one or more conductive contacts 836 to mechanically and/or electrically couple an integrated circuit die including the integrated circuit component 800 with another component (e.g., a printed circuit board). The integrated circuit component 800 may include additional or alternate structures to route the electrical signals from the interconnect layers 806-810; for example, the conductive contacts 836 may include other analogous features (e.g., posts) that route the electrical signals to external components.

In some embodiments in which the integrated circuit component 800 is double-sided (e.g., 902, FIG. 9), the integrated circuit component 800 may include another metallization stack (not shown) on the opposite side of the device layer(s) 804. This metallization stack may include multiple interconnect layers as discussed above with reference to the interconnect layers 806-810, to provide conductive pathways (e.g., including conductive lines and vias) between the device layer(s) 804 and additional conductive contacts (not shown) on the opposite side of the integrated circuit component 800 from the conductive contacts 836.

In other embodiments in which the integrated circuit component 800 is a double-sided, the integrated circuit component 800 may include one or more through silicon vias (TSVs) through the die substrate 802; these TSVs may make contact with the device layer(s) 804, and may provide conductive pathways between the device layer(s) 804 and additional conductive contacts (not shown) on the opposite side of the integrated circuit component 800 from the conductive contacts 836. In some embodiments, TSVs extending through the substrate can be used for routing power and ground signals from conductive contacts on the opposite side of the integrated circuit component 800 from the conductive contacts 836 to the transistors 840 and any other components integrated into the die, and the metallization stack 819 can be used to route I/O signals from the conductive contacts 836 to transistors 840 and any other components integrated into the die.

Multiple integrated circuit components 800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
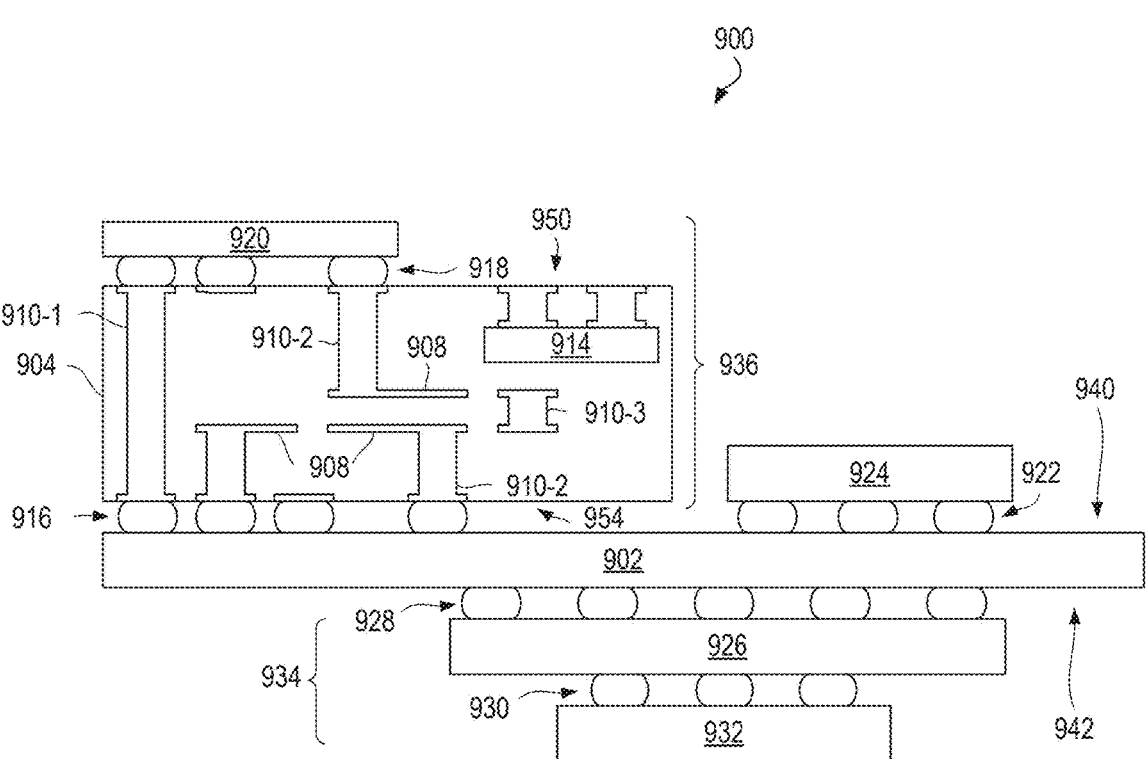
FIG. 9 is a cross-sectional side view of a microelectronic assembly that may include any of the embodiments disclosed herein.

FIG. 9 is a cross-sectional side view of a microelectronics assembly 900 that may include an apparatus or structure disclosed herein. The microelectronics assembly 900 includes a number of components disposed on a circuit board 902 (which may be a motherboard, system board, mainboard, etc.). The microelectronics assembly 900 includes components disposed on a first face 940 of the circuit board 902 and an opposing second face 942 of the circuit board 902; generally, components may be disposed on one or both faces 940 and 942.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. In some embodiments the circuit board 902 may be, for example, the PCB 102. The microelectronics assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 916 may serve as the coupling components illustrated or described for any of the substrate assembly or substrate assembly components described herein, as appropriate.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904. The interposer 904 may provide an intervening substrate used to bridge the circuit board 902 and the integrated circuit component 920.

The integrated circuit component 920 may be a packaged or unpacked integrated circuit product that includes one or more integrated circuit dies (e.g., the die 702 of FIG. 7, the integrated circuit component 800 of FIG. 8) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 920, a single monolithic integrated circuit die comprises solder bumps attached to contacts on the die. The solder bumps allow the die to be directly attached to the interposer 904. The integrated circuit component 920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 920 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art. In embodiments where the interposer is a non-printed circuit board The microelectronics assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The microelectronics assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Figure 10:
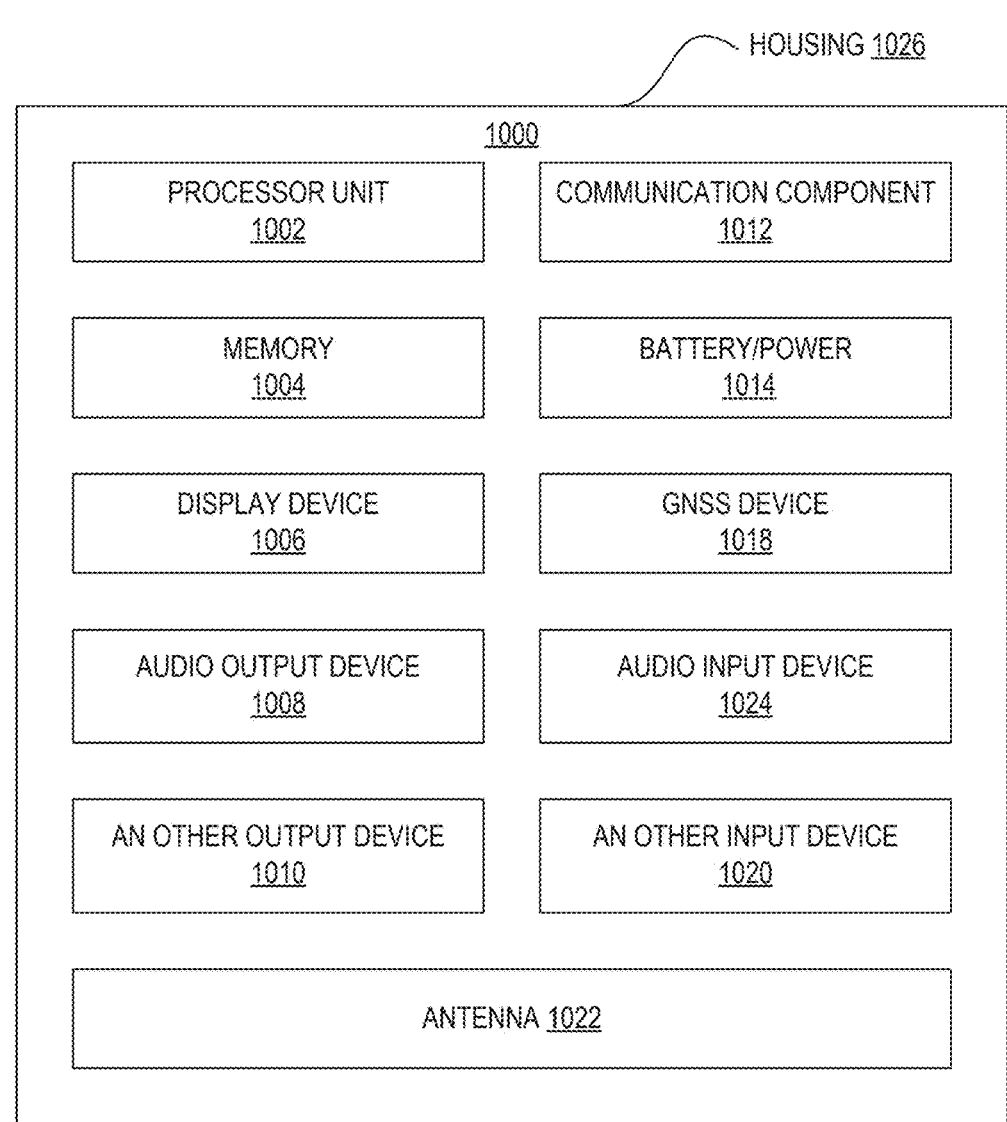
FIG. 10 is a block diagram of an example electrical device that may include any of the embodiments disclosed herein.

FIG. 10 is a block diagram of an example electrical device 1000 that may include an apparatus and/or structure disclosed herein. For example, any suitable ones of the components of the electrical device 1000 may include one or more of the apparatus (e.g., 100, 130, 140), structures (e.g., 208, 214, 216), microelectronic assemblies 900, integrated circuit components, or integrated circuit dies 702 disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards, mainboards, or system boards. In some embodiments, one or more of these components are fabricated onto a single system-on-a-chip (SoC) die. In some embodiments, some or all of the components included in the electrical device 1000 may be enclosed in a housing 1026.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include one or more processor units 1002, as defined herein. The electrical device 1000 may include a memory 1004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1004 may include memory that is located on the same integrated circuit die as the processor unit 1002. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 1000 can comprise one or more processor units 1002 that are heterogeneous or asymmetric to another processor unit 1002 in the electrical device 1000. There can be a variety of differences between the processing units 1002 in a system in terms of a spectrum of metrics of merit including architectural, micro-architectural, thermal, power consumption characteristics, and the like. These differences can effectively manifest themselves as asymmetry and heterogeneity among the processor units 1002 in the electrical device 1000.

In some embodiments, the electrical device 1000 may include a communication component 1012 (e.g., one or more communication components). For example, the communication component 1012 can manage wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1012 may operate in accordance with other wireless protocols in other embodiments.

The electrical device 1000 may include an antenna 1022 to facilitate wireless communications and/or to receive other wireless communications (such as AM or FM radio transmissions).

In some embodiments, the communication component 1012 may manage wired communications, such as electrical, optical, or any other suitable communication protocols (e.g., IEEE 802.3 Ethernet standards). As noted above, the communication component 1012 may include multiple communication components. For instance, a first communication component 1012 may be dedicated to shorter-range wireless communications such as Wi-Fi or Bluetooth, and a second communication component 1012 may be dedicated to longer-range wireless communications such as global positioning system (GPS), EDGE, GPRS, CDMA, WiMAX, LTE, EV-DO, or others. In some embodiments, a first communication component 1012 may be dedicated to wireless communications, and a second communication component 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any embedded or wired or wirelessly connected external device that generates an audible indicator, such speakers, headsets, or earbuds.

The electrical device 1000 may include an audio input device 1024 (or corresponding interface circuitry, as discussed above). The audio input device 1024 may include any embedded or wired or wirelessly connected device that generates a signal representative of a sound, such as microphones, microphone arrays, or digital instruments (e.g., instruments having a musical instrument digital interface (MIDI) output). The electrical device 1000 may include a Global Navigation Satellite System (GNSS) device 1018 (or corresponding interface circuitry, as discussed above), such as a Global Positioning System (GPS) device. The GNSS device 1018 may be in communication with a satellite-based system and may determine a geolocation of the electrical device 1000 based on information received from one or more GNSS satellites, as known in the art.

The electrical device 1000 may include another output device 1010 (or corresponding interface circuitry, as discussed above). Examples of the other output device 1010 may include an audio codec, a video codec, a printer, a wired or wireless transmitter for providing information to other devices, or an additional storage device.

The electrical device 1000 may include another input device 1020 (or corresponding interface circuitry, as discussed above). Examples of the other input device 1020 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1000 may be any other electronic device that processes data. In some embodiments, the electrical device 1000 may comprise multiple discrete physical components. Given the range of devices that the electrical device 1000 can be manifested as in various embodiments, in some embodiments, the electrical device 1000 can be referred to as a computing device or a computing system.

As used in this application and the claims, a list of items joined by the term "at least one of" can mean any combination of the listed terms. For example, the phrase "at least one of A, B and C" can mean A; B; C; A and B; A and C; B and C; or A, B, and C. Similarly, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and sub-combinations with one another. The disclosed methods, apparatuses, and systems are not limited to any specific aspect or feature or combination thereof, nor do the disclosed embodiments require that any one or more specific advantages be present, or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

Example 1 is an apparatus, comprising: a printed circuit board (PCB) with a peripheral edge; and an edge stiffener structure extending along at least a portion of the peripheral edge, the edge stiffener structure overlapping the peripheral edge on a surface of the PCB.

Example 2 includes the subject matter of Example 1, wherein the portion of the peripheral edge is 50% of the peripheral edge.

Example 3 includes the subject matter of Examples 1 or 2, wherein the edge stiffener structure overlaps the peripheral edge on the surface by less than 10 millimeters.

Example 4 includes the subject matter of Examples 1 or 2, wherein the edge stiffener structure overlaps the peripheral edge on the surface by a width in a range of 1 to 3 millimeters.

Example 5 includes the subject matter of any of the preceding Examples, wherein the surface is a first surface, and the edge stiffener structure further overlaps the peripheral edge on a second surface that is opposite the first surface of the PCB.

Example 6 includes the subject matter of any of the preceding Examples, further comprising an integrated circuit component fastened to the PCB.

Example 7 includes the subject matter of any of Examples 1-5, wherein the surface is a first surface, and further comprising: multiple integrated circuit components fastened to the PCB; wherein a first integrated circuit component of the multiple integrated circuit components is fastened to the first surface and a second integrated circuit component of the multiple integrated circuit components is fastened to a second surface of the PCB.

Example 8 includes the subject matter of any of the preceding Examples, wherein the edge stiffener structure is fastened to the PCB using a plurality of solder bumps.

Example 9 includes any of Examples 1-7, wherein the edge stiffener structure is fastened to the PCB using an adhesive.

Example 10 includes the subject matter of any of the preceding Examples, wherein the PCB is rectangular, with two opposing sides being defined as long sides, and the edge stiffener structure is located on a long side.

Example 11 includes the subject matter of any of the preceding Examples, wherein the edge stiffener structure comprises multiple segments.

Example 12 includes the subject matter of Example 11, wherein at least one of the multiple segments is a corner stiffener.

Example 13 includes the subject matter of any of the preceding Examples, wherein the edge stiffener structure comprises an extension that projects laterally away from the PCB.

Example 14 includes the subject matter of any of the preceding Examples, in which the edge stiffener structure is removably attached to the PCB.

Example 15 includes any of the Examples 1-13, in which the edge stiffener structure is attached to the PCB only on vertical sides of the PCB.

Example 16 is a device, comprising: a printed circuit board (PCB) with a peripheral edge; an edge stiffener structure extending along at least a portion of the peripheral edge, the edge stiffener structure overlapping the peripheral edge on a first surface of the PCB; a top securing structure attached to the edge stiffener structure on an upper surface of the PCB; and a bottom securing structure attached to the top securing structure on a lower surface of the PCB; and the top securing structure or the bottom securing structure is thinned to accommodate the edge stiffener structure.

Example 17 includes the subject matter of Example 16, further comprising an integrated circuit component attached to the PCB.

Example 18 includes the subject matter of Examples 16 or 17, wherein the bottom securing structure is a D-cover or a chassis.

Example 19 includes the subject matter of any of Examples 16-18, wherein the top securing structure is a C-cover.

Example 20 includes the subject matter of any of Examples 16-19, wherein the edge stiffener structure is fastened to the PCB using a plurality of solder bumps.

Example 21 includes the subject matter of any of Examples 16-19, wherein the edge stiffener structure is fastened to the PCB using an adhesive.

Example 22 includes the subject matter of any of Examples 16-21, wherein the edge stiffener structure comprises multiple segments.

Example 23 includes the subject matter of Example 22, wherein at least one of the multiple segments is a corner stiffener.

Example 24 includes the subject matter of any of Examples 16-23, wherein the edge stiffener structure further comprises: an extension that projects laterally away from the PCB; and the extension is configured to fit into one of the top securing structure or the bottom securing structure.

Example 25 includes the subject matter of any of Examples 16-23, wherein the edge stiffener structure further comprises: a first extension that projects laterally away from the PCB and into the top securing structure; and a second extension that projects laterally away from the PCB and into the bottom securing structure.

Example 26 includes the subject matter of any of Examples 16-25, in which the edge stiffener structure is removably attached to the PCB.

Example 27 includes the subject matter of any of Examples 16-25, in which the edge stiffener structure is attached to the PCB only on vertical sides of the PCB.

What is claimed is:

1. An apparatus, comprising:
   a printed circuit board (PCB) with a peripheral edge; and
   an edge stiffener structure including a first portion extending along at least a portion of the peripheral edge, the edge stiffener structure further including a second portion overlapping the peripheral edge on a surface of the PCB, wherein the edge stiffener structure comprises an extension that projects laterally from the first portion of the edge stiffener structure away from the PCB and is configured to fit into a securing structure adjacent to the first portion of the edge stiffener structure.

2. The apparatus of claim 1, wherein the portion of the peripheral edge is 50% of the peripheral edge.

3. The apparatus of claim 1, wherein the edge stiffener structure overlaps the peripheral edge on the surface by less than 10 millimeters.

4. The apparatus of claim 1, wherein the edge stiffener structure overlaps the peripheral edge on the surface by a width in a range of 1 to 3 millimeters.

5. The apparatus of claim 1, wherein the surface is a first surface, and the edge stiffener structure further overlaps the peripheral edge on a second surface that is opposite the first surface of the PCB.

6. The apparatus of claim 1, further comprising an integrated circuit component fastened to the PCB.

7. The apparatus of claim 1, wherein the surface is a first surface, and further comprising:
   multiple integrated circuit components fastened to the PCB;
   wherein a first integrated circuit component of the multiple integrated circuit components is fastened to the first surface and a second integrated circuit component of the multiple integrated circuit components is fastened to a second surface of the PCB.

8. The apparatus of claim 1, wherein the edge stiffener structure is fastened to the PCB using a plurality of solder bumps.

9. The apparatus of claim 1, wherein the edge stiffener structure is fastened to the PCB using an adhesive.

10. The apparatus of claim 1, wherein the PCB is rectangular, with two opposing sides being defined as long sides, and the edge stiffener structure is located on a long side.

11. The apparatus of claim 1, wherein the edge stiffener structure comprises multiple segments.

12. The apparatus of claim 11, wherein at least one of the multiple segments is a corner stiffener.

13. The apparatus of claim 1, in which the edge stiffener structure is removably attached to the PCB.

14. The apparatus of claim 1, in which the edge stiffener structure is attached to the PCB only on vertical sides of the PCB.

15. A device, comprising:

a printed circuit board (PCB) with a peripheral edge;

an edge stiffener structure including a first portion extending along at least a portion of the peripheral edge, the edge stiffener structure further including a second portion overlapping the peripheral edge on a first surface of the PCB;

a top securing structure including an upper portion extending generally parallel to an upper surface of the PCB;

a bottom securing structure attached to the top securing structure and to the PCB on a lower surface of the PCB such that the PCB is secured between the top securing structure and the bottom securing structure, the bottom securing structure including a lower portion extending along at least the second portion of the edge stiffener structure, wherein the lower portion of the bottom securing structure has a first length in an x-direction that is greater than a second length of the second portion of the edge stiffener structure in the x-direction; and the top securing structure or the bottom securing structure is thinned to accommodate the edge stiffener structure.

16. The device of claim 15, further comprising an integrated circuit component attached to the PCB.

17. The device of claim 15, wherein the bottom securing structure is a D-cover or a chassis.

18. The device of claim 15, wherein the top securing structure is a C-cover.

19. The device of claim 15, wherein the edge stiffener structure is fastened to the PCB using a plurality of solder bumps.

20. The device of claim 15, wherein the edge stiffener structure is fastened to the PCB using an adhesive.

21. The device of claim 15, wherein the edge stiffener structure comprises multiple segments.

22. The device of claim 21, wherein at least one of the multiple segments is a corner stiffener.

23. The device of claim 15, wherein the edge stiffener structure further comprises:

an extension that projects laterally from the PCB; and the extension is configured to fit into one of the top securing structure or the bottom securing structure.

24. The device of claim 15, wherein the edge stiffener structure further comprises:

a first extension that projects laterally from the PCB and into the top securing structure; and a second extension that projects laterally from the PCB and into the bottom securing structure.

25. The device of claim 15, wherein the top securing structure includes a first side portion adjacent to at least part of the first portion of the edge stiffener structure, where the bottom securing structure includes a second side portion adjacent to at least part of the first portion of the edge stiffener structure, wherein the bottom securing structure is attached to the top securing structure such that a lower edge of the first side portion and an upper edge of the second side portion are adjacent.

* * * * *